Aug. 18, 1970 H. L. RAPER ET AL 3,524,996
MULTIPLEXER SWITCH USING AN ISOLATION DEVICE
Filed March 29, 1967
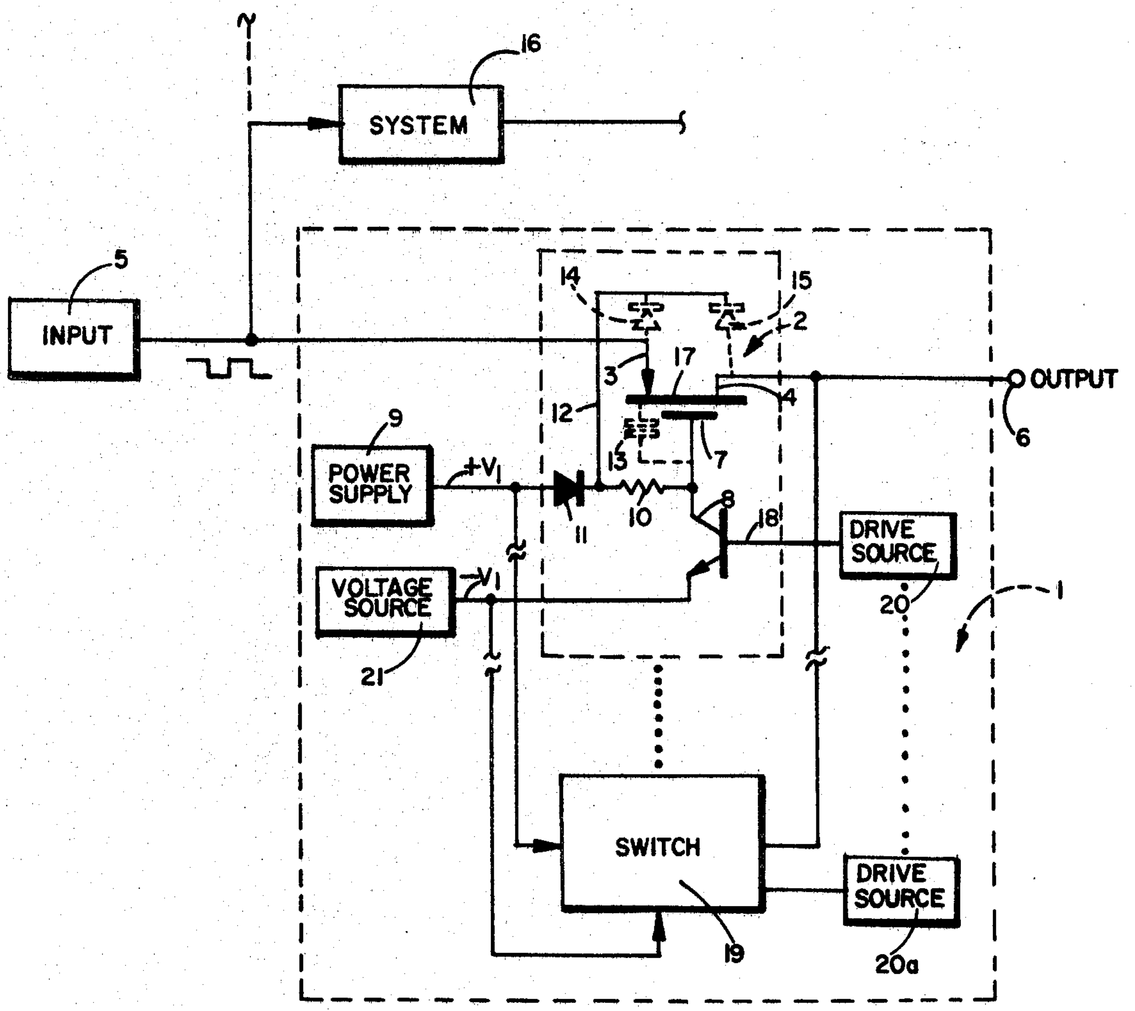
INVENTORS
HUBERT L. RAPER
JOHN J. MIELKE
BY Robert G Rogers
ATTORNEY 3,524,996

MULTIPLEXER SWITCH USING AN ISOLATION DEVICE

Hubert L. Raper, La Habra, and John J. Mielke, Huntington Beach, Calif., assignors to North American Rockwell Corporation, a corporation of Delaware Filed Mar. 29, 1967, Ser. No. 626,890
Int. Cl. H03k 17/00
U.S. Cl. 307—251 1 Claim

ABSTRACT OF THE DISCLOSURE

A diode switch inserted between the substrate in which the multiplexer switching device is formed and the power supply connected to the substrate and the control electrode of said multiplexer switch.

BACKGROUND OF THE INVENTION

Field of the invention

The invention relates to an improved multiplexer switch and, more specifically, to such a multiplexer switch in which an isolation device is interposed between the multiplexer switch and a power source to the switch.

Description of prior art

In most applications involving multiplex switches produced from MOS devices, a power source is connected to the substrate (or body) electrode of each switch and to the gate electrode of each switch. An impedance is interposed between the substrate and gate electrodes for providing a charge (or discharge) path for the interelectrode capacitance associated with the device while the device is being switched off. However, the source and drain junctions of a switch form diodes with the substrate semiconductor material. As a result, if the substrate power supply is turned off (zero volts) the source or drain to substrate diodes may turn on in the presence of an input signal. Although the switch is not turned on, the input may be reduced from its required level, that is, it is loaded. Since the input signals may also be used as inputs to other systems and/or subsystems, a reduced level may impair the operation of the other systems. Permanent damage may also occur to said switch or the input signal source due to the low impedance path to ground when the substrate power is turned off (zero volts). Desirably, means should be provided for isolating the substrate from the power supply so that when the supply is turned off, the input is not loaded. Such a means would enable a particular switch to be turned off without effecting the operatiton of any other system.

SUMMARY OF THE INVENTION

Briefly, the invention comprises isolation means interposed between the substrate in which multiplexer switches are formed and the power supply to the substrate and the control electrode of the switch.

In one embodiment, the multiplexer switches are produced by a plurality of MOS-FET (metal oxide semiconductor-field effect transistor) devices. A single diode is inserted between the substrate in which the device is formed and the power supply which holds the switch off. As a result, even if the power supply is set to zero, the input voltage cannot turn the source (or drain) electrode on. In other words, the zero voltage of the power supply is isolated from the source and drain electrodes.

Therefore, it is an object of this invention to provide an improved multiplexer switch having an isolating capability.

Still a further object of this invention is to provide a MOS switch used as a multiplexer switch in which the power supply can be isolated from the input.

Another object of this invention is to provide a MOS device having an isolation input when the power supply to the device is turned off.

A still further object of this invention is to isolate source electrodes of MOS devices from electrical ground when the device is turned off.

These and other objects of the invention will become more apparent in connection with the following drawings.

BRIEF DESCRIPTION OF THE DRAWING

The figure shows one embodiment of a multiplexer switch having an isolation device.

BRIEF DESCRIPTION OF THE PREFERRED EMBODIMENTS

The figure shows multiplexer system 1, switch 2 comprising field effect transistor 17 having source electrode 3 and drain electrode 4. The source and drain are connected between input means 5 and output means 6, respectively. The input means may comprise a flip flop or other alternative signal generating circuits. The transistor also includes gate or control electrode 7.

The gate electrode is connected to control transistor 8 and to power supply 9. Resistor 10 and diode 11 are interposed between the gate and the power supply. Conductor 12 is connected between the diode and the resistor. The other end of the conductor is connected to the substrate (not shown) in which the transistor is formed.

An effective capacitance 13 is formed between the gate electrode and the surface of the substrate. In addition, the source and drain electrodes form P-N junctions 14 and 15 with the substrate. The junction and the capacitor are shown by the dotted lines.

Control transistor 8 includes base electrode 18 connected to a drive source 20. The drive source may be comprised of circuitry which generates a signal for turning the transistor on. The emitter of the transistor is connected to a source of negative voltage $-V_1$. The collector is connected to the gate electrode of transistor 17.

The system further comprises additional switches similar to switch 2. Of the additional switches, only switch 19 is illustrated. The intervening switches are omitted for clarity. The outputs from the switches are connected to a common point. The voltage sources and drive source for the plurality of switches are the same.

System 16 is shown as having its input driven by the input means to the multiplexer system. System 16 may be a digital to analog converter gating network register, or other systems and/or subsystems requiring an alternating signal. The system ordinarily is not connected to the multiplexer system except through the input. Although only one system is shown, it should be obvious that a plurality of separate systems may be driven by the input means.

Details on the process for forming field effect and other devices which can be used in practicing this invention are not described. Such details are believed well known to those skilled in the art. For example, impurities may be diffused into an N type substrate for forming separate P type regions comprising source and drain regions. Conductors are deposited on the surface of the substrate to the region for forming input and output terminals to that region. An additional insulated electrode is deposited over the region separating the P type regions. Although a P type device is shown in the figure, it should be obvious that N type devices could also be used. Voltage polarities may have to be changed according to the impurities of the device being used.

In operation, transistor 8 is turned on by a signal on its base electrode. Voltage $-V_1$ appears at the gate electrode of transistor 2. Effective capacitor 13 is charged. Diode 11 is turned on and $+V_1$ appears on the substrate (the negative side of the junctions). When an input signal appears, the transistor is turned on and the signal appears at the output. It is assumed that the maximum input signal is less than $+V_1$ and greater than $-V_1$. When the drive signal is off, diode 11 remains on and the gate electrode is set at $+V_1$. Capacitor 13 is discharged (or charged) from $-V_1$ to $+V_1$ when transistor 8 is cut off.

In addition to isolating the power supply zero volts (electrical ground) from the junction, isolation is provided for isolating the junction from electrical ground through transistor 8 when $-V_1$ and the drive source are turned off (zero volts). In other words, if transistor 8 had been an off-on switch which could be on under the zero voltage conditions outlined, it would be possible to have the junctions of switch 2 turned on for loading the input. Therefore, under certain conditions both possible electrical grounds must be isolated. By using transistor 8 the additional isolation required is provided.

If, for example, diode 11 was omitted, as in prior art devices, and $+V_1$ was connected to zero volts, when the input signal became positive, the P-N junctions would turn and "load" the input. As a result, the inputs to other systems may be reduced to such a level as to impair their operating capabilities. Permanent damage could also occur. The P-N junctions do not turn on because the zero level is isolated from the substrate.

It should be noted that the description herein assumes ideal diodes (isolation devices) and that no leakage current occurs. In the event there is leakage current, a slight loading effect may be present, depending on the amount of leakage current.

Although the invention has been described and illustrated in detail, it is to be understood that the same is by way of illustration and example only, and is not to be taken by way of limitation; the spirit and scope of this invention being limited only by the terms of the appended claim.

We claim:

1. A multiplex switching system having at least one switching device and at least one other system, said multiplex switching system comprising, a power supply that is preselectively set to a zero voltage level, an input signal generator providing an input signal to said switching device and to said other systems, a field effect transistor having a source electrode connected to said input signal generator, and a control electrode, a diode connected between the substrate of said field effect transistor and said power supply for preventing loading of said input signal generator so that the signal from said generator to said other systems is not reduced when said power supply is set to said zero voltage level, a resistor connected between said diode and said control electrode for coupling said power supply to said control electrode at certain intervals, said power supply holding said transistor off when coupled to said control electrode, drive means connected to said control electrode for holding said field effect transistor on during the intervals that the power supply is not coupled to the control electrode.

References Cited

UNITED STATES PATENTS

| | | | |
|---|---|---|---|
| 3,268,658 | 8/1966 | Schroeder et al. | 307—251 X |
| 3,313,958 | 4/1967 | Bowers | 307—251 |
| 3,327,133 | 6/1967 | Sickles | 307—251 |
| 3,355,598 | 11/1967 | Tuska | 307—251 |

JOHN S. HEYMAN, Primary Examiner

H. A. DIXON, Assistant Examiner